(12) United States Patent
Um

(10) Patent No.: US 9,493,875 B2
(45) Date of Patent: Nov. 15, 2016

(54) SHOWER HEAD UNIT AND CHEMICAL VAPOR DEPOSITION APPARATUS

(71) Applicant: EUGENE TECHNOLOGY CO., LTD., Gyeonggi-do (KR)

(72) Inventor: Pyung-yong Um, Gyeonggi-do (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 163 days.

(21) Appl. No.: 14/220,678

(22) Filed: Mar. 20, 2014

(65) Prior Publication Data

US 2014/0202388 A1 Jul. 24, 2014

Related U.S. Application Data

(63) Continuation-in-part of application No. 11/573,439, filed on Sep. 30, 2008, now abandoned.

(51) Int. Cl.
*C23C 16/455* (2006.01)

(52) U.S. Cl.
CPC .............................. *C23C 16/45565* (2013.01)

(58) Field of Classification Search
CPC ............................................... C23C 16/45565
USPC ....................................... 118/715; 156/345.1
See application file for complete search history.

(56) References Cited

U.S. PATENT DOCUMENTS

| | | | | |
|---|---|---|---|---|
| 4,780,169 A | * | 10/1988 | Stark | H01J 37/3244 156/345.34 |
| 5,415,753 A | * | 5/1995 | Hurwitt | C23C 14/0068 204/192.12 |
| 5,422,139 A | * | 6/1995 | Fischer | C23C 16/455 118/715 |
| 5,439,524 A | * | 8/1995 | Cain | C23C 16/45565 118/715 |
| 5,500,256 A | * | 3/1996 | Watabe | C23C 16/45561 118/715 |
| 5,589,002 A | * | 12/1996 | Su | H01J 37/3244 118/723 E |
| 5,781,693 A | * | 7/1998 | Ballance | C23C 16/45565 118/724 |

(Continued)

FOREIGN PATENT DOCUMENTS

| | | |
|---|---|---|
| CN | 1450598 | 10/2003 |
| JP | 05175135 A * | 7/1993 |

(Continued)

OTHER PUBLICATIONS

Chinese Office Action issued in corresponding to Application No. 2005800272486 dated Apr. 11, 2008.

(Continued)

*Primary Examiner* — Rudy Zervigon
(74) *Attorney, Agent, or Firm* — Rabin & Berdo, P.C.

(57) ABSTRACT

A chemical vapor deposition apparatus comprises a chamber, a chamber lead having a gas in port configured to receive a reaction gas, the chamber lead connected to a top surface of the chamber to seal up the chamber, a shower head connected to the chamber lead, the shower head having a plurality of spray holes separated from each other for spraying the reaction gas onto the surface of a wafer in the chamber, and a protrusion surrounding the spray holes on the bottom surface of the shower head so that an induction groove is provided inside the protrusion, wherein the plurality of spray holes have a plurality of main holes and a plurality of supplementary holes, each of the main holes is uniformly arranged in each corner of a square-grid pattern across the shower head and each of the supplementary holes is disposed at each centerpoint of the square-grid pattern.

18 Claims, 9 Drawing Sheets

(56) References Cited

U.S. PATENT DOCUMENTS

| | | | |
|---|---|---|---|
| 5,792,269 A * | 8/1998 | Deacon | C23C 16/45565 118/715 |
| 5,819,434 A * | 10/1998 | Herchen | H01J 37/3244 156/345.34 |
| 6,024,799 A * | 2/2000 | Chen | C23C 16/455 118/715 |
| 6,050,506 A * | 4/2000 | Guo | C23C 16/455 239/558 |
| 6,059,885 A * | 5/2000 | Ohashi | C23C 16/4401 118/715 |
| 6,079,356 A * | 6/2000 | Umotoy | C23C 16/455 118/723 E |
| 6,080,446 A * | 6/2000 | Tobe | C23C 16/34 257/E21.168 |
| 6,106,625 A * | 8/2000 | Koai | C23C 16/455 118/715 |
| 6,250,250 B1 * | 6/2001 | Maishev | H01J 37/32009 118/723 ER |
| 6,381,021 B1 * | 4/2002 | Somekh | G01N 21/55 356/445 |
| 6,454,860 B2 | 9/2002 | Metzner | C23C 16/407 118/715 |
| 6,461,435 B1 * | 10/2002 | Littau | C23C 16/455 118/715 |
| 6,553,932 B2 | 4/2003 | Liu et al. | |
| 6,565,661 B1 * | 5/2003 | Nguyen | C23C 16/4557 118/715 |
| 6,631,692 B1 | 10/2003 | Matsuki et al. | |
| 6,800,139 B1 * | 10/2004 | Shinriki | C23C 16/409 118/715 |
| 6,942,753 B2 * | 9/2005 | Choi | C23C 16/5096 118/715 |
| 7,008,484 B2 * | 3/2006 | Yim | C23C 16/45565 118/715 |
| 7,270,713 B2 * | 9/2007 | Blonigan | C23C 16/455 118/715 |
| 7,429,410 B2 * | 9/2008 | Keller | H01J 37/3244 427/578 |
| 7,581,511 B2 * | 9/2009 | Mardian | C23C 16/045 118/723 ER |
| 7,829,145 B2 * | 11/2010 | Balasubramanian | C23C 16/4405 427/255.28 |
| 8,083,853 B2 * | 12/2011 | Choi | C23C 16/345 118/715 |
| 8,702,867 B2 * | 4/2014 | Choi | C23C 16/45565 118/715 |
| 8,869,742 B2 * | 10/2014 | Dhindsa | C23C 16/4412 118/723 E |
| 9,184,028 B2 * | 11/2015 | Dhindsa | H01J 37/32091 |
| 2002/0187647 A1 | 12/2002 | Dhindsa et al. | |
| 2003/0207033 A1 * | 11/2003 | Yim | C23C 16/45565 427/255.37 |
| 2003/0209323 A1 * | 11/2003 | Yokogaki | C23C 16/45565 156/345.34 |
| 2004/0003777 A1 * | 1/2004 | Carpenter | C23C 16/45565 118/715 |
| 2004/0035358 A1 * | 2/2004 | Basceri | C23C 16/45514 118/715 |
| 2004/0129211 A1 * | 7/2004 | Blonigan | C23C 16/455 118/715 |
| 2004/0238123 A1 * | 12/2004 | Becknell | H01J 37/32357 156/345.33 |
| 2005/0223986 A1 * | 10/2005 | Choi | C23C 16/4405 118/715 |
| 2005/0251990 A1 * | 11/2005 | Choi | C23C 16/345 29/558 |
| 2005/0255257 A1 * | 11/2005 | Choi | C23C 16/345 427/585 |
| 2006/0005926 A1 * | 1/2006 | Kang | H01J 37/32082 156/345.34 |
| 2006/0054280 A1 * | 3/2006 | Jang | C23C 16/45565 156/345.34 |
| 2006/0060138 A1 * | 3/2006 | Keller | H01J 37/3244 118/715 |
| 2006/0228490 A1 * | 10/2006 | Wang | C23C 16/45565 427/457 |
| 2006/0228496 A1 * | 10/2006 | Choi | H01J 37/32449 427/569 |
| 2006/0236934 A1 * | 10/2006 | Choi | C23C 16/345 118/715 R |
| 2008/0020146 A1 * | 1/2008 | Choi | C23C 16/345 427/446 |
| 2008/0178807 A1 * | 7/2008 | Wang | C23C 16/45565 118/723 R |
| 2008/0305246 A1 * | 12/2008 | Choi | C23C 16/45565 427/74 |
| 2010/0006031 A1 * | 1/2010 | Choi | C23C 16/45565 118/723 R |

FOREIGN PATENT DOCUMENTS

| | | | | |
|---|---|---|---|---|
| JP | 10-150026 | | 6/1998 | |
| JP | 2000-269149 | | 9/2000 | |
| KR | 10-2000-0062949 A | | 10/2000 | |
| KR | 10-2001-0104669 A | | 11/2001 | |
| WO | WO 01/16396 A1 * | | 3/2001 | C23C 16/455 |
| WO | WO01/16396 * | | 8/2001 | C23C 16/455 |

OTHER PUBLICATIONS

Korean Office Action issued in corresponding to Application No. 952006002755359 dated Jan. 8, 2006.

\* cited by examiner

SHOWER HEAD UNIT AND CHEMICAL VAPOR DEPOSITION APPARATUS

CROSS-REFERENCE TO RELATED APPLICATIONS

This is a Continuation-in-part application of U.S. application Ser. No. 11/573,439, filed on Sep. 30, 2008, which claims the benefit of priority from Korean Patent Application No. 10-2004-0063047, filed on Aug. 11, 2004, the disclosures of both of which are expressly incorporated by reference herein in their entireties.

FIELD OF THE INVENTION

The present invention relates to a shower head of a chemical vapor deposition apparatus capable of spraying a process reaction gas (hereinafter, referred to as a reaction gas) on the surface of a semiconductor wafer so that the reaction gas is thermally decomposed on the semiconductor wafer to be deposited on the surface of the semiconductor wafer as a thin film of uniform thickness.

DESCRIPTION OF THE RELATED ART

As illustrated in FIG. 1, which is a sectional view of a conventional chemical vapor deposition apparatus 1, the chemical vapor deposition apparatus 1 includes a chamber 10 having a chamber inside 11 so that a shower head 40 and a heater 50 are mounted therein, a gas in port 21 formed on one side so that a reaction gas is flown from the outside, a chamber lead 20 combined with the top surface of the chamber 10 by fastening means to seal up the chamber 10, a block plate 30 in which the received reaction gas is distributed by through holes 31 provided on the bottom surface of the chamber lead 20 to form a low temperature region, a plurality of spray holes 41 for spraying the distributed reaction gas onto the surface of a wafer 60, a shower head 40 having a plurality of fastening holes 42 formed along the outer circumference thereof to be fastened with the chamber lead 20, and a heater 50 on whose top surface the wafer 60 is settled and on whose bottom surface a heater supporter 51 is provided, the heater 50 being provided in the chamber inside 11 to be separated from the shower head 40 by a predetermined distance.

Thin film deposition using the chemical vapor deposition apparatus 1 is applied to a field of processing a material film on the surface of a wafer in fabrication of a semi-conductor device and an LCD substrate, to be specific, to fabrication of a wiring line apparatus having electric conductivity, deposition of an oxide film or a nitride film for insulating conductive material films using chemical, and deposition of a high dielectric thin film used for a DRAM or a flash memory device. The thin film is deposited in order to form an insulating film or a wiring line film having electrical characteristic in a CVD process of depositing a process reaction gas on the surface of a wafer in order to fabricate the semiconductor device or the LCD substrate.

As described above, the reaction gas is uniformly sprayed onto the surface of the wafer to be deposited using the chemical vapor deposition. In the shower head of the conventional chemical vapor deposition apparatus 1, the spray holes for spraying the reaction gas are not closely arranged so that it is not possible to uniformly spray the reaction gas onto the surface of the wafer. Therefore, the thin film is not uniformly deposited on the surface of the wafer, which results in deterioration of the quality of products and cause defects in following processes. As a result, productivity deteriorates.

Accordingly, it is an object of the present invention to provide a shower head of a chemical vapor deposition apparatus in which the spray holes formed on the surface of the shower head are divided into main holes and supplementary holes provided in the blind spots among the main spray holes so that sprayed reaction gas can be deposited onto the surface of a wafer as a thin film of uniform thickness.

SUMMARY OF THE INVENTION

In order to achieve the above object, there is provided a shower head of a chemical vapor deposition apparatus comprising a chamber having a chamber inside so that a shower head and a heater are mounted therein, a gas in port formed on one side so that a reaction gas is flown from the outside, a chamber lead combined with the top surface of the chamber by fastening means to seal up the chamber, a block plate in which the received reaction gas is distributed by through holes provided on the bottom surface of the chamber lead to form a low temperature region, a plurality of spray holes for spraying the distributed reaction gas onto the surface of a wafer, a shower head having a plurality of fastening holes formed along the outer circumference thereof to be fastened with the chamber lead, and a heater on whose top surface the wafer is settled and on whose bottom surface a heater supporter is provided, the heater being provided in the chamber inside to be separated from the shower head by a predetermined distance. A plurality of main holes are formed in the center of the top surface of the shower head to be separated from each other by the same distance. A plurality of supplementary holes are separated from the main holes by the same distance to intersect the main holes. Protrusions are formed in the center of the bottom surface of the shower head. An induction groove is provided between the protrusions to form the lower parts of the main holes and the supplementary holes. The induction groove is extended toward the lower part.

BRIEF DESCRIPTION OF THE FIGURES

These and/or other objects and advantages of the invention will become apparent and more readily appreciated from the following description of the preferred embodiments, taken in conjunction with the accompanying drawings of which.

DETAILED DESCRIPTION OF THE INVENTION

Hereinafter, preferred embodiments of the present invention will be described with reference to the attached drawings.

Figure 1:
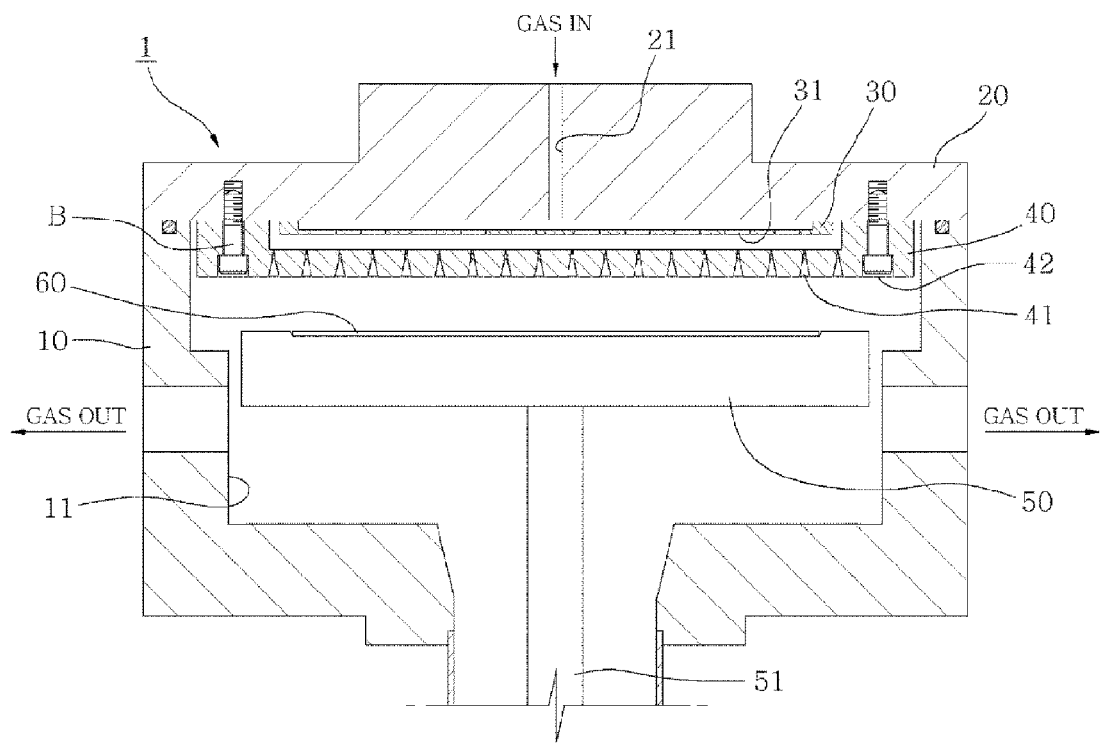
FIG. 1 is a sectional view of a conventional chemical vapor deposition apparatus.
Figure 2:
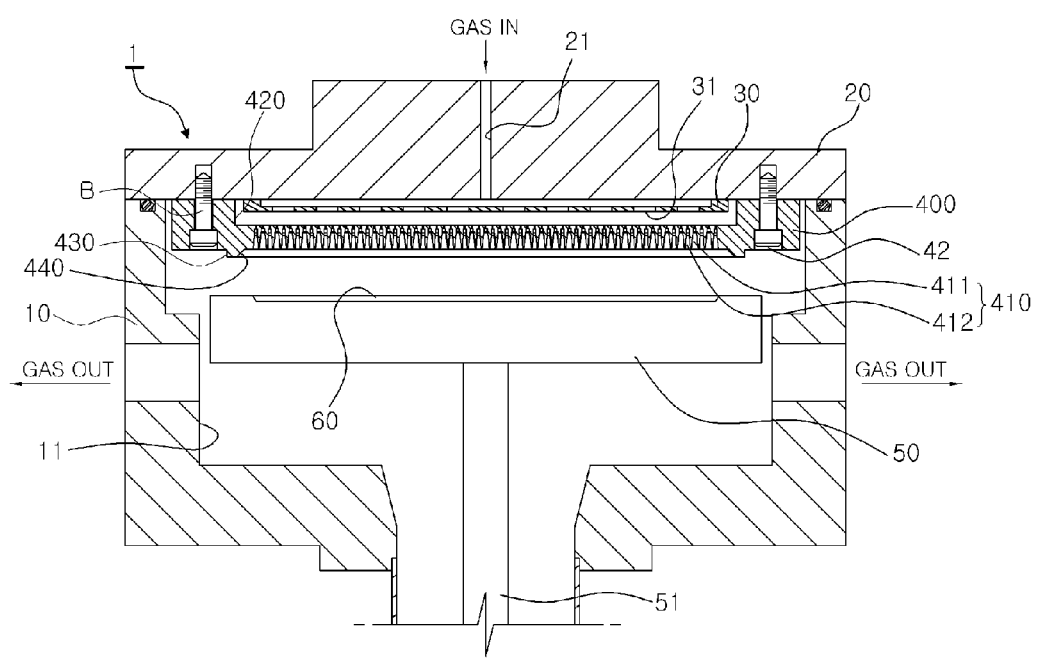
FIG. 2 is a sectional view of a chemical vapor deposition apparatus in which a shower head according to the present invention is mounted.

FIG. 2 is a sectional view of a chemical vapor deposition apparatus 1 according to the present invention. In order to deposit a thin film on the surface of a wafer 60, a reaction gas is flown from a gas in port 21 of a chamber lead 20 and the received reaction gas reaches a block plate 30 that is a low temperature region formed on the bottom surface of the chamber lead 20. At this time, the reaction gas is first distributed by a plurality of through holes 31 formed in the block plate 30 and the distributed reaction gas is flown to main holes 411 and supplementary holes 412 of a shower head 400 fastened to the chamber lead 20 and having an insertion groove 420 to correspond to the block plate 30. The received reaction gas is uniformly sprayed through protrusions 430 formed in the center of the bottom surface of the shower head 400 and an induction groove 440 provided inside the protrusions 430. The bottom surface of the shower head 400 is flat. At this time, the spray holes 410 are divided into the main holes 411 and the supplementary holes 412 so that the reaction gas is uniformly and correctly deposited on the surface of the wafer 60 to remove the blind spots that the reaction gas does not reach. The protrusions 430 are formed on the bottom surface of the shower head 400 and the induction groove 440 is formed between the protrusions 430 so that the reaction gas that flows from the spray holes 410 are not concentrated on the outer parts. In particular, the induction groove 440 extends toward the lower part so that the reaction gas can be effectively sprayed and deposited onto the surface of the wafer 60 formed on the top surface of the heater 50.

Figure 3:
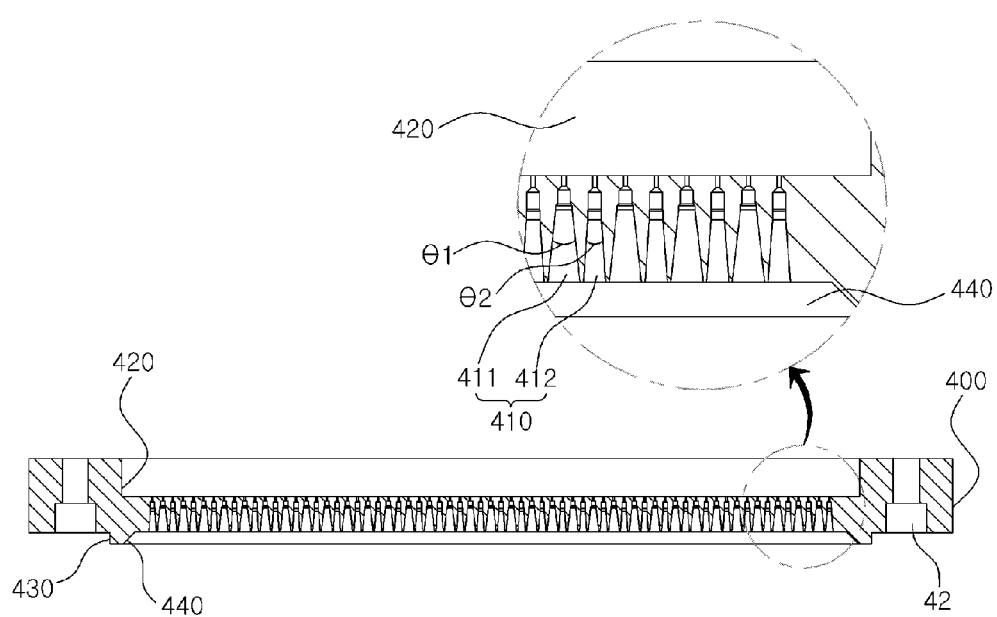
FIG. 3 is a sectional view of a shower head according to the present invention.
Figure 4:
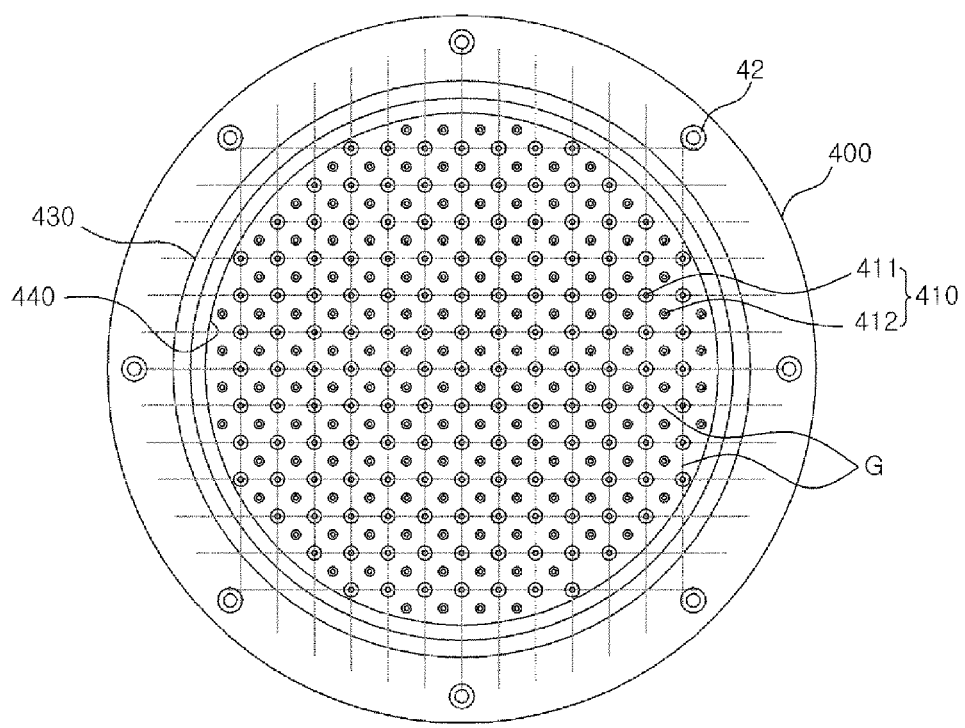
FIG. 4 is a plan view of FIG. 3.

As illustrated in the sectional view of FIG. 3 and the plan view of FIG. 4, the shower head 400 includes a predetermined insertion groove 420 into which the block plate 30 is inserted from the top surface to the inside of the shower head 400, the plurality of main holes 411 formed on the surface of the insertion groove 420 to be separated from each other by the same distance, the plurality of supplementary holes 412 that are separated from the main holes 411 by the same distance and that intersect the main holes 411, and a plurality of fastening holes 42 for bolt B fastening the shower head 400 to the chamber lead 20. The bottom surface of the insertion groove 420 is flat.

Figure 6:
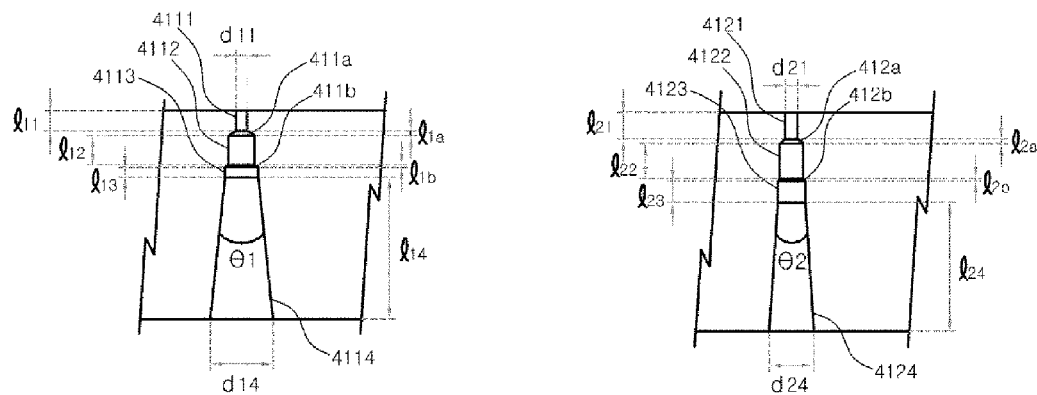
FIG. 6 is an enlarged view of FIG. 3.

Specifically, as illustrated in FIG. 6, the main hole 411 has a main entrance hole 4111, a main connection hole 4112/4113, a main exit hole 4114. The main entrance hole 4111 is positioned on the uppermost of the main hole 411 and the main exit hole 4114 is positioned on the lowermost of the main hole 411. The main connection hole 4112/4113 is positioned between the main entrance hole 4111 and the main exit hole 4114. A first main connection hole 4112 is positioned to be close to the main entrance hole 4111 and a second main connection hole 4113 is positioned to be close to the main exit hole 4114.

The main entrance hole 4111 and the main connection hole 4112/4113 have a constant diameter to be a straight-type, the diameter of the main connection hole 4112/4113 is larger than the diameter d11 of the main entrance hole 4111 and the diameter of the second main connection hole 4113 is larger than the diameter of the first main connection hole 4112. A first main diffusion hole 411a is positioned between the main entrance hole 4111 and the first main connection hole 4112, the first main diffusion hole 411a has a flared shape. The diameter of the upper end of the first main diffusion hole 411a is equal to the diameter d11 of the main entrance hole 4111 and the diameter of the lower end of the first main diffusion hole 411a is equal to the diameter of the first main connection hole 4112. A second main diffusion hole 411b is positioned between the first main connection hole 4112 and the second main connection hole 4113, the second main diffusion hole 411b has a flared shape. The diameter of the upper end of the second main diffusion hole 411b is equal to the diameter of the first main connection hole 4112 and the diameter of the lower end of the second main diffusion hole 411b is equal to the diameter of the second main connection hole 4113.

The main exit hole 4114 is extended from the lower end of the second main connection hole 4113 so that the diameter of the upper end of the main exit hole 4114 is equal to the second main connection hole 4113. The main exit hole 4114 has a taper angle θ1 (ex. 12-13°) so that the diameter of the main exit hole 4114 is increased from top to bottom. Consequently, the diameter of the main hole 411 is increased from top to bottom so that the reaction gas is diffused gradually through the main hole 411.

Also, the supplementary hole 412 has a supplementary entrance hole 4121, a supplementary connection hole 4122/4123, a supplementary exit hole 4124. The supplementary entrance hole 4121 is positioned on the uppermost of the supplementary hole 412 and the supplementary exit hole 4124 is positioned on the lowermost of the supplementary hole 412. The supplementary connection hole 4122/4123 is positioned between the supplementary entrance hole 4121 and the supplementary exit hole 4124. A first supplementary connection hole 4122 is positioned to be close to the supplementary entrance hole 4121 and a second supplementary connection hole 4123 is positioned to be close to the supplementary exit hole 4124.

The supplementary entrance hole 4121 and the supplementary connection hole 4122/4123 have a constant diameter to be a straight-type, the diameter of the supplementary connection hole 4122/4123 is larger than the diameter d11 of the supplementary entrance hole 4121 and the diameter of the second supplementary connection hole 4123 is larger than the diameter of the supplementary main connection hole 4122. A first supplementary diffusion hole 412a is positioned between the supplementary entrance hole 4121 and the first supplementary connection hole 4122, the first supplementary diffusion hole 412a has a flared shape. The diameter of the upper end of the first supplementary diffusion hole 412a is equal to the diameter d21 of the supplementary entrance hole 4121 and the diameter of the lower end of the first supplementary diffusion hole 412a is equal to the diameter of the first supplementary connection hole 4122. A second supplementary diffusion hole 412b is positioned between the first supplementary connection hole 4122 and the second supplementary connection hole 4123, the second supplementary diffusion hole 412b has a flared shape. The diameter of the upper end of the second supplementary diffusion hole 412b is equal to the diameter of the first supplementary connection hole 4122 and the diameter of the lower end of the second supplementary diffusion hole 412b is equal to the diameter of the second supplementary connection hole 4123.

The supplementary exit hole 4124 is extended from the lower end of the second supplementary connection hole 4123 so that the diameter of the upper end of the supplementary exit hole 4124 is equal to the second supplementary connection hole 4123. The supplementary exit hole 4124 has a taper angle θ2 (ex. 6-7°) so that the diameter of the supplementary exit hole 4124 is increased from top to bottom. Consequently, the diameter of the supplementary hole 412 is increased from top to bottom so that the reaction gas is diffused gradually through the supplementary hole 411. The taper angle θ1 is wider than the taper angle θ2.

Comparing the main hole 411 to the supplementary hole 412, the supplementary entrance hole 4121 is longer than the main entrance hole 4111 (121>11), the supplementary connection hole 4122/4123 is longer than the main connection hole 4112/4113 (122>112). The main exit hole 4114 is longer than the supplementary exit hole 4124 (114>124). However, the total length of the main hole 411 is equal to the total length of the supplementary hole 412, the main exit hole 4114 and the supplementary exit hole 4124 is longer than the half of the length of the main hole 411 (or the supplementary hole 412).

Figure 5:
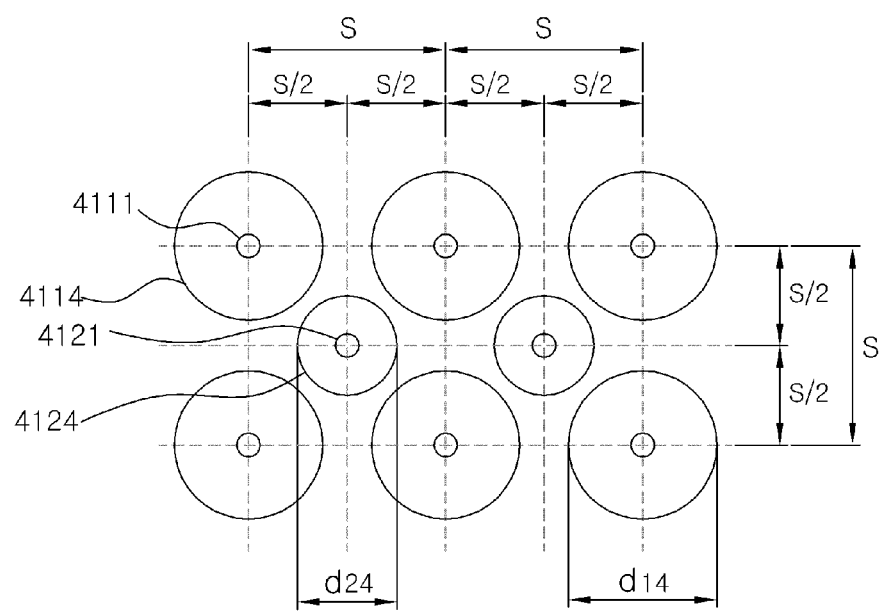
FIG. 5 is an enlarged view of FIG. 4.

As illustrated in FIGS. 4 & 5, each of the main holes 411 is uniformly arranged in each corner of a square-grid pattern G across the shower head. One side of the square-grid pattern G has a length of S. The centers of the main entrance hole 4111 and the main exit hole 4114 are positioned on the corner of the square-grid pattern G. Also, each of the supplementary holes 412 is disposed at each centerpoint of the square-grid pattern G and the supplementary hole 412 is separated from four main holes 411 at same distance. The centers of the supplementary entrance hole 4121 and the supplementary exit hole 4124 are positioned on the centerpoint of the square-grid pattern G.

The diameter d11 of the main entrance hole 4111 is equal to the diameter d21 of the supplementary entrance hole 4121 (ex. d11=d21=0.5 mm), but the diameter of the main exit hole 4114 is larger than the diameter of the supplementary exit hole 4124. The diameter d24 of the lower end of the supplementary exit hole 4124 is half of the length S of the one side of the square-grid pattern G (ex. d24=S/2=2 mm) and the length S of the one side of the square-grid pattern G is larger than the diameter d14 of the lower end of the main exit hole 4114 (ex. d14=3 mm).

The arrangement of the main holes 411 and the supplementary holes 412 in the square-grid pattern G enable the shower head 400 to have a lot of spray holes 410. In other words, if the shower head 400 has only the main holes 411 or the supplementary holes 412, the number of the spray holes 410 is limited due to the area of the shower head 400 so that the shower head 400 cannot have a lot of spray holes 410. A lot of spray holes 410 helps to spray the reaction gas uniformly through the spray holes 410 so that the deposited film has a uniform thickness.

Figure 7:
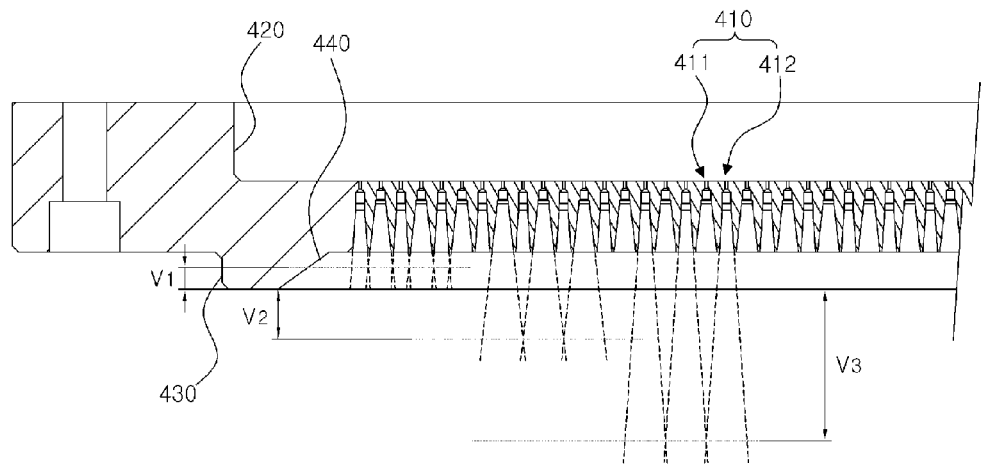
FIG. 7 illustrates a flow of a reaction gas sprayed through a spray holes.

As illustrated in FIG. 7, if a first line is extended from the inner surface of the main exit hole 4114 and a second line is extended from the inner surface of the supplementary exit hole 4124, the first line and the second line intersect at the collision position that is positioned between the lower end of the shower head 400 and the lower end of the protrusion 430. Therefore, the reaction gas sprayed through the main holes 411 collides with the reaction gas sprayed through the supplementary holes 412 in the induction groove 440 and the reaction gases are partly dispersed. At this time, because the induction groove 440 restricts the space for the diffusion of the reaction gas, the reaction gases stagnated temporarily in the induction groove 440 and the reaction gases are fully dispersed. However, if a first line is extended from the inner surface of the main exit hole 4114 and a second line is extended from the inner surface of the main exit hole 4114, the first line and the second line intersect at the collision position that is positioned below the lower end of the protrusion 430. Also, if a first line is extended from the inner surface of the supplementary exit hole 4124 and a second line is extended from the inner surface of the supplementary exit hole 4124, the first line and the second line intersect at the collision position that is positioned below the lower end of the protrusion 430. Therefore, if the shower head 400 has only the main holes 411 or the supplementary holes 412, the collision of the reaction gas occurred outside the induction groove 440 and the above-mentioned dispersion does not occur. V1,V2,V3 mean a distance between the lower end of the protrusion 430 and the collision position, respectively (V2<V3).

Figure 8:
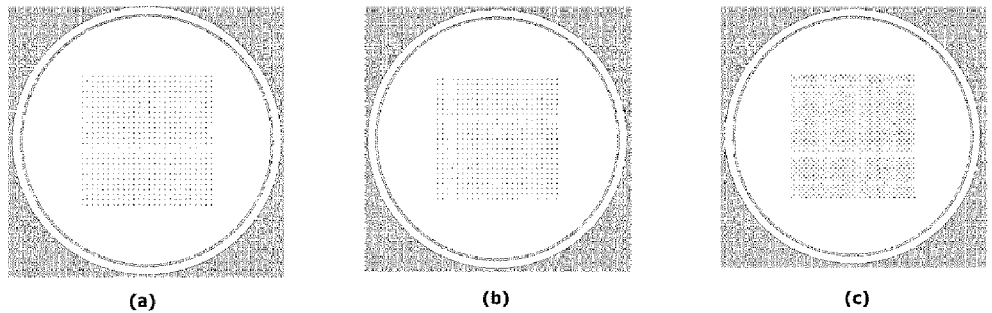
FIG. 8 illustrates three types of a shower head.

FIG. 8(a) illustrates that the shower head 400 has only the supplementary holes 412, the total number of the spray holes 410 (or the supplementary holes 412) is 676. FIG. 8(b) illustrates that the shower head 400 has only the main holes 411, the total number of the spray holes 410 (or the main holes 411) is 625. FIG. 8(c) illustrates that the shower head 400 has the main holes 411 and the supplementary holes 412, the total number of the spray holes 410 (or the main holes 411/the supplementary holes 412) is 676. As discussed above, In case FIG. 8(a),(b), the collision of the reaction gas occurred outside the induction groove 440. In case FIG. 8(c), the collision of the reaction gas occurred inside the induction groove 440.

Figure 9:
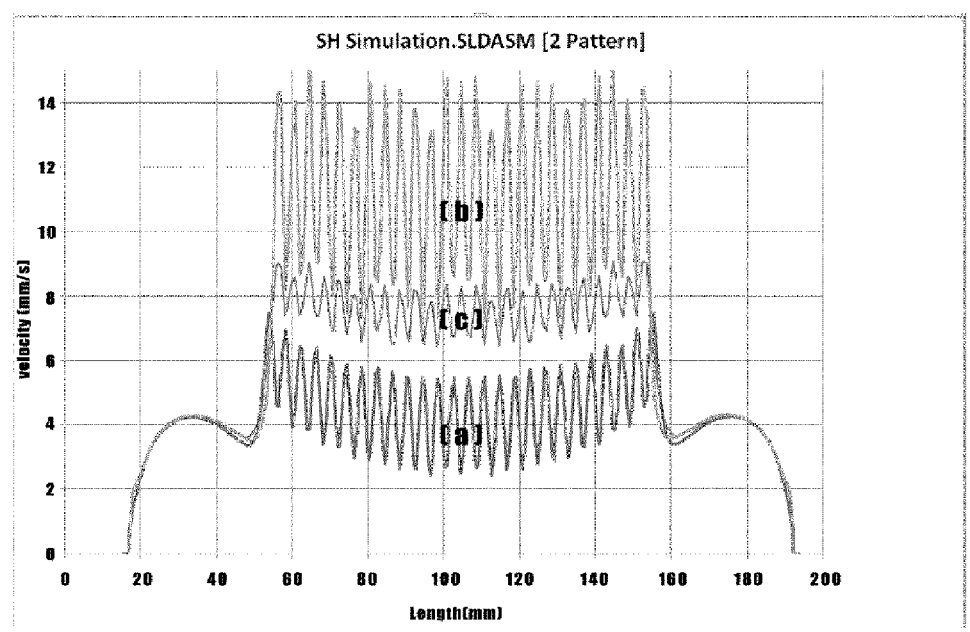
FIG. 9 illustrates a deviation of flow velocity in three types of a shower head.

FIG. 9 illustrates a deviation of flow velocity in three types of a shower head when the reaction gas is sprayed (ex. the reaction gas=5,000 sccm). The deviation of flow velocity is measured at the position that is separated from the lower end of the protrusion 430 by V1. (a),(b),(c) in FIG. 9 correspond to FIG. 8(a),(b),(c). Comparing FIG. 8(a),(b) to FIG. 8(c) about the deviation of fluid velocity, the deviations of the shower head 400 of FIG. 8(a),(b) are much higher than the deviation of the shower head 400 of FIG. 8(c). Therefore, the shower head 400 of FIG. 8(a),(b) cannot spray the reaction gas uniformly so that the deposited film has a non-uniform thickness. However, the shower head 400 of FIG. 8(c) can spray the reaction gas uniformly so that the deposited film has a uniform thickness. Specifically, in case of that the shower head 400 of FIG. 8(c) is close to the heater 50, the reaction gas can be uniformly sprayed and the deposited film has a high uniformity.

Figure 10:
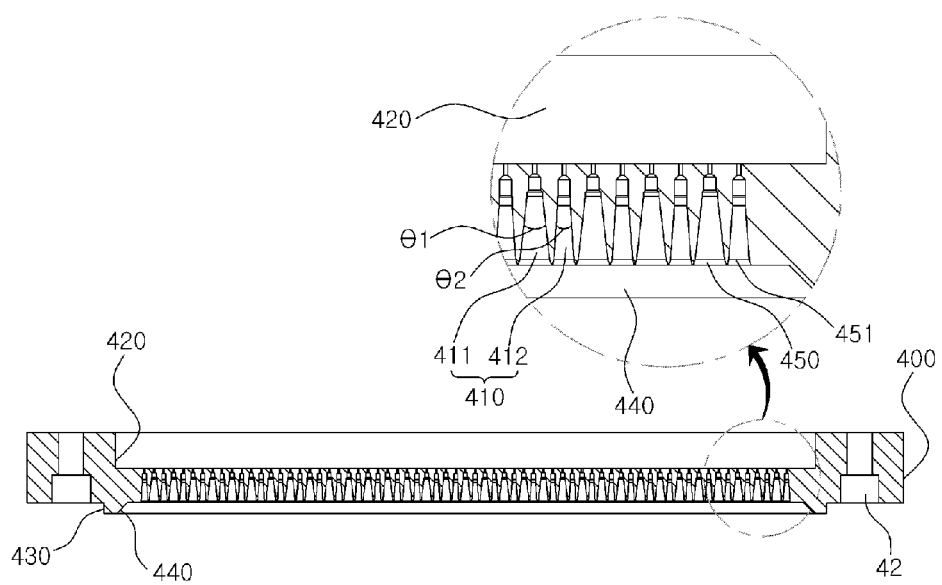
FIG. 10 is a sectional view of a shower head according to another embodiment of the present invention.
Figure 11:
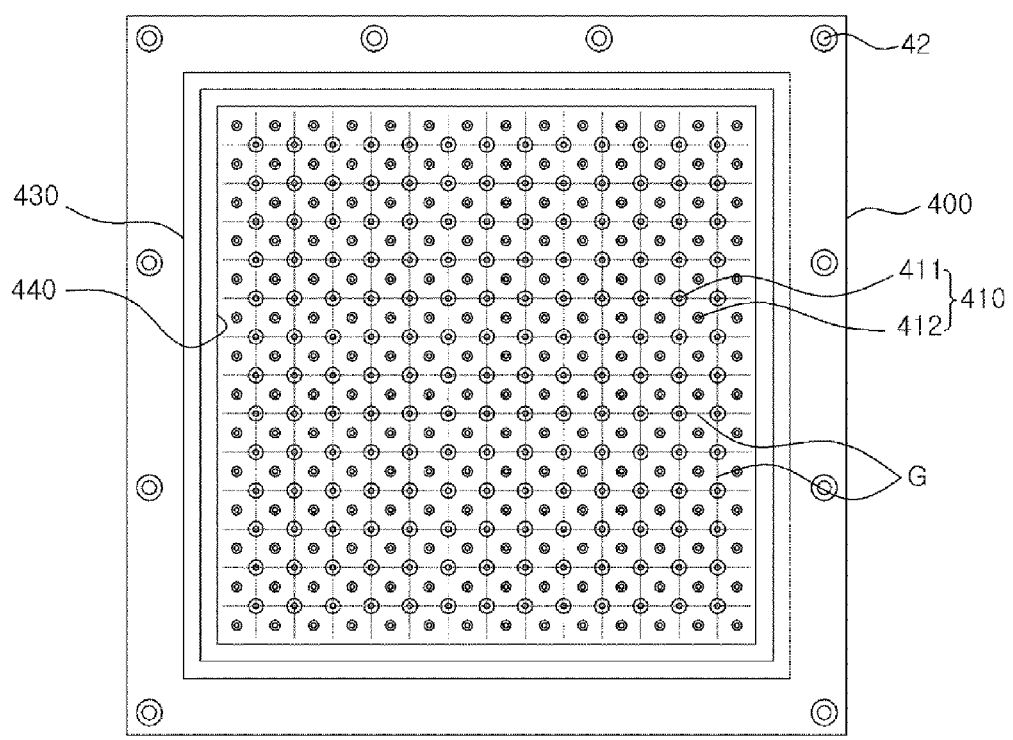
FIG. 11 is a plan view of the shower head according to another embodiment of the present invention.

FIG. 10 is a sectional view of a shower head according to another embodiment of the present invention. The lower parts 450 of the main holes 411 and the lower parts 451 of the supplementary holes 412 formed from top to bottom are extended so that the reaction gas is rapidly and widely sprayed. FIG. 11 is a plan view of the shower head according to another embodiment of the present invention. The shape of the shower head varies, however, the spray holes 410 and the induction groove 440 formed between the protrusions 430 are the same.

According to the shower head of the present invention, the main holes and the supplementary holes remove the blind spots so that it is possible to uniformly spray the reaction gas and to thus deposit the thin film of uniform thickness on the surface of the semiconductor wafer. As a result, it is possible to improve productivity.

According to the shower head of the chemical vapor deposition apparatus for depositing the reaction gas on the surface of the wafer, the supplementary holes are added in order to remove the blind spots of the spray holes and the induction groove is formed in order to prevent the reaction gas from being concentrated so that it is possible to uniformly and stably deposit the thin film on the surface of the wafer.

What is claimed is:

1. A chemical vapor deposition apparatus comprising:
    a chamber;
    a chamber lead having a gas in port configured to receive a reaction gas, the chamber lead connected to a top surface of the chamber to seal up the chamber;
    a shower head connected to the chamber lead, the shower head having a plurality of spray holes separated from each other for spraying the reaction gas onto the surface of a wafer in the chamber; and
    a protrusion protruding from a bottom surface of the shower head and surrounding the spray holes on the bottom surface of the shower head so that an induction groove is provided inside the protrusion, wherein a portion of the bottom surface of the shower head surrounded by the protrusion is flat,
    wherein the plurality of spray holes have a plurality of main holes and a plurality of supplementary holes, the main holes are uniformly arranged such that each of the main holes is located at each intersecting point of a virtual square-grid pattern across the shower head, and the supplementary holes are uniformly arranged separately from the main holes such that each of the supplementary holes is located at each centerpoint of the virtual square-grid pattern,
    wherein each of the supplementary holes has a supplementary exit hole having a taper angle and each of the main holes has a main exit hole having a taper angle that is wider than the taper angle of the supplementary hole, and
    wherein the main holes and the supplementary holes are arranged such that a first virtual line extended along an inner surface of the main exit hole and a second virtual line extended along an inner surface of the supplementary exit hole intersect at a collision position that is positioned between a lower end of the shower head and a lower end of the protrusion so that the reaction gas sprayed through the main holes collides with the reaction gas sprayed through the supplementary holes in the induction groove, the supplementary exit hole being positioned on the lowermost of the supplementary hole and the main exit hole being positioned on the lowermost of the main hole.

2. The chemical vapor deposition apparatus of claim 1, wherein the diameter of the main exit hole and the diameter of the supplementary exit hole increase from top to bottom.

3. The chemical vapor deposition apparatus of claim 1, wherein the plurality of spray holes have a flared shape.

4. The chemical vapor deposition apparatus of claim 1, further comprising:
    a heater mounted in the chamber and disposed below the shower head, the wafer is disposed on the heater so that the reaction gas is thermally decomposed on the wafer to be deposited on the surface of the wafer as a thin film.

5. The chemical vapor deposition apparatus of claim 1, wherein the shower head has an insertion groove formed on a top surface of the shower head, the insertion groove is configured to communicate with the gas in port so that the reaction gas is supplied to the insertion grove, and the spray holes are formed on the bottom surface of the insertion groove,
    the chemical vapor deposition apparatus further comprising:
        a block plate provided on the bottom surface of the chamber lead and installed in the insertion groove, the block plate having a plurality of through holes that distribute the received reaction gas from the gas in port toward the spray holes.

6. The chemical vapor deposition apparatus of claim 1, wherein the main hole has a main entrance hole positioned on the uppermost of the main hole and a main connection hole positioned between the main entrance hole and the main exit hole, the supplementary hole has a supplementary entrance hole positioned on the uppermost of the supplementary hole and a supplementary connection hole positioned between the supplementary entrance hole and the supplementary exit hole,
    wherein the main entrance hole and the main connection hole have a constant diameter to be a straight-type, the diameter of the main connection hole being larger than the diameter of the main entrance hole,
    wherein the supplementary entrance hole and the supplementary connection hole have a constant diameter to be a straight-type, the diameter of the supplementary connection hole being larger than the diameter of the supplementary entrance hole.

7. The chemical vapor deposition apparatus of claim 6, wherein the supplementary entrance hole is longer than the main entrance hole, the supplementary connection hole is longer than the main connection hole, the main exit hole is longer than the supplementary exit hole.

8. The chemical vapor deposition apparatus of claim 6, wherein the diameter of the main entrance hole is equal to the diameter of the supplementary entrance hole, the diameter of the lower end of the main exit hole is larger than the diameter of the lower end of the supplementary exit hole.

9. The chemical vapor deposition apparatus of claim 1, wherein the diameter of the lower end of the main exit hole is larger than the diameter of the lower end of the supplementary exit hole, the diameter of the lower end of the supplementary exit hole being half of the length of one side of the virtual square-grid pattern and the length of one side of the virtual square-grid pattern being longer than the diameter of the lower end of the main exit hole.

10. The chemical vapor deposition apparatus of claim 1, wherein a lower part of the main exit holes is chamfered with a greater angle than the taper angle of the main exit holes and a lower part of the supplementary exit holes is chamfered with a greater angle than the taper angle of the supplementary exit holes.

11. A shower head unit for spraying a reaction gas onto a surface of a wafer having:
    a shower head having a plurality of spray holes separated from each other for spraying the reaction gas onto the surface of a wafer; and
    a protrusion protruding from a bottom surface of the shower head and surrounding the spray holes on the bottom surface of the shower head so that an induction groove is provided inside the protrusion, wherein a portion of the bottom surface of the shower head surrounded by the protrusion is flat,
    wherein the plurality of spray holes have a plurality of main holes and a plurality of supplementary holes, the main holes are uniformly arranged such that each of the main holes is located at each intersecting point of a virtual square-grid pattern across the shower head, and the supplementary holes are uniformly arranged separately from the main holes such that each of the supplementary holes is located at each centerpoint of the virtual square-grid pattern, wherein each of the supplementary holes has a supplementary exit hole having a taper angle and each of the main holes has a main exit hole having a taper angle that is wider than the taper angle of the supplementary hole, and wherein the main holes and the supplementary holes are arranged such that a first virtual line extended along an inner surface of the main exit hole and a second virtual line extended along an inner surface of the supplementary exit hole intersect at a collision position that is positioned between a lower end of the shower head and a lower end of the protrusion so that the reaction gas sprayed through the main holes collides with the reaction gas sprayed through the supplementary holes in the induction groove, the supplementary exit hole being positioned on the lower most of the supplementary hole and the main exit hole being positioned on the lowermost of the main hole.

12. The shower head unit of claim 11, wherein the plurality of spray holes have a flared shape.

13. The shower head unit of claim 11, wherein the shower head has an insertion groove formed on a top surface of the shower head, and the spray holes are formed on the bottom surface of the insertion groove, the shower head unit further comprising:
a block plate installed in the insertion groove, the block plate having a plurality of through holes that distribute the received reaction gas toward the spray holes.

14. The shower head unit of claim 11, wherein the diameter of the main exit hole and the diameter of the supplementary exit hole increase from top to bottom.

15. The shower head unit of claim 11, wherein the main hole has a main entrance hole positioned on the uppermost of the main hole and a main connection hole positioned between the main entrance hole and the main exit hole, the supplementary hole has a supplementary entrance hole positioned on the uppermost of the supplementary hole and a supplementary connection hole positioned between the supplementary entrance hole and the supplementary exit hole, wherein the main entrance hole and the main connection hole have a constant diameter to be a straight-type, the diameter of the main connection hole being larger than the diameter of the main entrance hole, wherein the supplementary entrance hole and the supplementary connection hole have a constant diameter to be a straight-type, the diameter of the supplementary connection hole being larger than the diameter of the supplementary entrance hole.

16. The shower head unit of claim 15, wherein the supplementary entrance hole is longer than the main entrance hole, the supplementary connection hole is longer than the main connection hole, the main exit hole is longer than the supplementary exit hole.

17. The shower head unit of claim 15, wherein the diameter of the main entrance hole is equal to the diameter of the supplementary entrance hole, the diameter of the lower end of the main exit hole is larger than the diameter of the lower end of the supplementary exit hole.

18. The shower head unit of claim 11, wherein the diameter of the lower end of the main exit hole is larger than the diameter of the lower end of the supplementary exit hole, the diameter of the lower end of the supplementary exit hole being half of the length of one side of the virtual square-grid pattern and the length of one side of the virtual square-grid pattern being longer than the diameter of the lower end of the main exit hole.

* * * * *